United States Patent
Yu et al.

(10) Patent No.: US 7,629,655 B2
(45) Date of Patent: Dec. 8, 2009

(54) SEMICONDUCTOR DEVICE WITH MULTIPLE SILICIDE REGIONS

(75) Inventors: Chen-Hua Yu, Hsin-Chu (TW); Cheng-Tung Lin, Jhudong Township (TW); Chen-Nan Yeh, Hsin Chih (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 11/688,592

(22) Filed: Mar. 20, 2007

(65) Prior Publication Data

US 2008/0230844 A1    Sep. 25, 2008

(51) Int. Cl.
*H01L 29/78*    (2006.01)
(52) U.S. Cl. ............... 257/377; 257/384; 257/E29.255
(58) Field of Classification Search ................ 257/377, 257/384, E29.255
See application file for complete search history.

(56) References Cited

U.S. PATENT DOCUMENTS

| | | | |
|---|---|---|---|
| 6,441,433 B1 * | 8/2002 | En et al. ............... | 257/344 |
| 2001/0030350 A1 | 10/2001 | Oowaki et al. | |
| 2002/0031883 A1 | 3/2002 | Sayama | |
| 2002/0117725 A1 | 8/2002 | Oowaki et al. | |
| 2002/0137268 A1 * | 9/2002 | Pellerin et al. ............... | 438/197 |
| 2006/0043434 A1 | 3/2006 | Huang et al. | |
| 2006/0138562 A1 * | 6/2006 | Okuno et al. ............... | 257/384 |
| 2006/0244075 A1 * | 11/2006 | Chen et al. ................... | 257/384 |

FOREIGN PATENT DOCUMENTS

CN    1210810 A    3/1999

* cited by examiner

*Primary Examiner*—Trung Dang
(74) *Attorney, Agent, or Firm*—Slater & Matsil, L.L.P.

(57) ABSTRACT

A system and method for forming a semiconductor device with a reduced source/drain extension parasitic resistance is provided. An embodiment comprises implanting two metals (such as ytterbium and nickel for an NMOS transistor or platinum and nickel for a PMOS transistor) into the source/drain extensions after silicide contacts have been formed. An anneal is then performed to create a second silicide region within the source/drain extension. Optionally, a second anneal could be performed on the second silicide region to force a further reaction. This process could be performed to multiple semiconductor devices on the same substrate.

20 Claims, 6 Drawing Sheets

SEMICONDUCTOR DEVICE WITH MULTIPLE SILICIDE REGIONS

TECHNICAL FIELD

The present invention relates generally to a system and method for making semiconductor devices and, more particularly, to a system and method for making semiconductor devices with a reduced parasitic resistance in the source/drain extensions.

BACKGROUND

Figure 1:
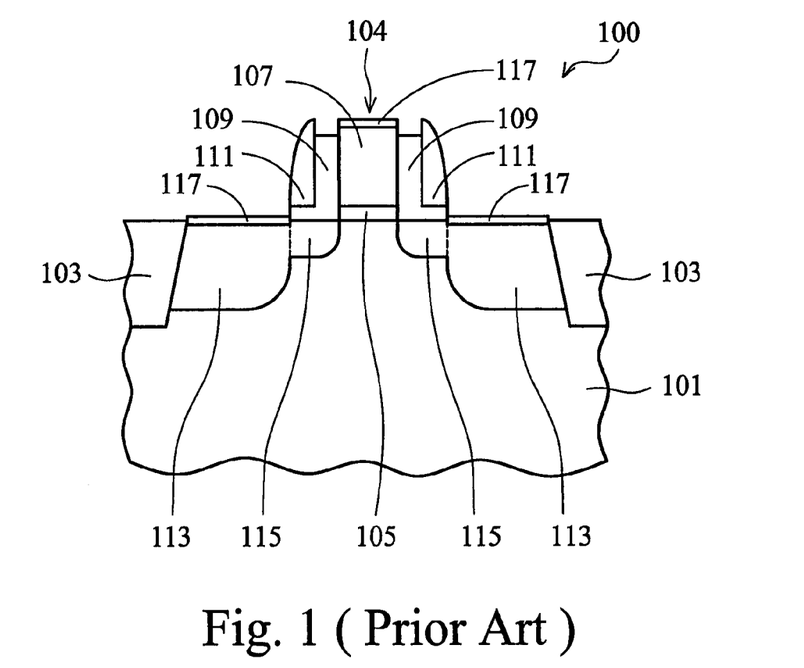
FIG. 1 is a transistor as known in the prior art.

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. Generally, as illustrated in FIG. 1, a transistor 100 is formed on a portion of a substrate 101 that is separated from other active areas by isolation regions 103. A gate stack 104 includes a gate dielectric 105 and a gate electrode 107. Source/drain extensions 115 are formed using the gate stack 104 as a mask, such that the source/drain extensions 115 are aligned with the gate stack 104. Spacers, such as a first layer of spacers 109 and a second layer of spacers 111 illustrated in FIG. 1, are formed alongside the gate stack 104. The source/drain regions 113 are formed using the first layer of spacers 109, the second layer of spacers 111 and the gate stack 104 as a mask. Current flowing through the source/drain regions 113 may then be controlled by controlling the voltage levels applied to the gate electrode 107.

To increase switching speed and decrease contact resistance, the source/drain regions 113 are often silicided. Typically, the source/drain regions 113, as well as the gate electrode 107, are silicided by forming a metal layer over the source/drain regions 113 and gate electrode 107, and then performing an anneal. The annealing causes the metal layer to react with the silicon substrate, thereby forming a silicide layer 117 on the source/drain regions 113 and the gate electrode 107. The silicide layer 117, however, may cause problems.

One such problem is a parasitic resistance that arises in the source/drain extensions 115. This parasitic resistance degrades the conduction current and lowers the overall efficiency of the transistor.

Therefore, there is a need for a transistor structure and a method of manufacture for a transistor that exhibits low contact resistance as well as reduces the parasitic resistance.

SUMMARY OF THE INVENTION

This and other problems are generally solved or circumvented, and technical advantages are generally achieved, by embodiments of the present invention which allow for a reduced parasitic resistance in the source and drain regions of a semiconductor device.

One aspect of the present invention includes a semiconductor device on an isolated section of a substrate. This semiconductor device comprises a gate dielectric, a gate electrode, spacers, source/drain extensions on opposing sides of the gate dielectric, and source/drain regions on opposing sides of gate electrode. Furthermore, the semiconductor device comprises two sets of silicide regions. The first set is located over the source/drain regions and the gate electrode. The second set is located within the source/drain extensions.

Another aspect of the present invention includes a semiconductor device comprising a first NMOS device in a first region and a first PMOS device in a second region of the substrate. Each MOS device has a gate stack, spacers along the sidewalls of the gate stacks, source/drain extensions on opposing sides of the gate stacks, and source/drain regions on opposing sides of the gate stacks and the source/drain extensions. Further, the first NMOS device has a first set of silicide regions located over the source/drain regions and the gate electrode, and also has a second set of silicide regions located within the source/drain extensions in the first region of the substrate. The first PMOS device has a third set of silicide regions located over the source/drain regions and the gate electrode, and also has a fourth set of silicide regions located within the source/drain extensions in the second region of the substrate.

Yet another aspect of the present invention is a transistor comprising a gate stack with spacers formed in an isolated area of a substrate. The transistor also comprises a set of source/drain extensions on opposite sides of the gate stack and a set of source/drain regions on opposite sides of the gate stack and the set of source/drain extensions. A first set of silicide regions are located on the source/drain regions and the gate stack, and a second set of silicide regions are located within the set of source/drain extensions.

An advantage of an embodiment of the present invention is that the parasitic resistances that are normally associated with the source/drain extensions are reduced. This results in an overall improvement in the conduction current of the device.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a pair of semiconductor transistors with a reduced parasitic resistance in the source/drain extensions. The invention may also be applied, however, to other semiconductor devices.

Figure 2:
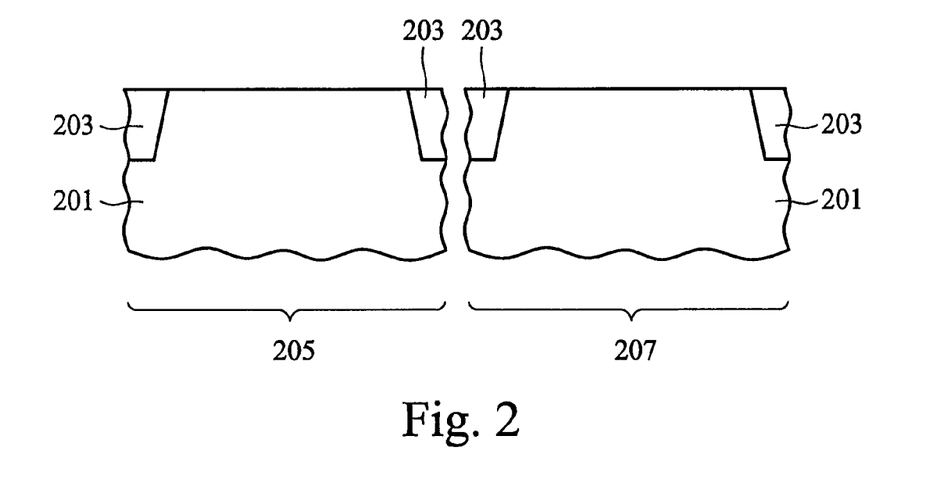
FIGS. 2-12 are illustrations of steps in the formation of two transistors in accordance with an embodiment of the present invention.

With reference now to FIG. 2, there is shown a substrate 201 with shallow trench isolations (STIs) 203 formed therein. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The STIs 203 are generally formed by etching the substrate 201 to form a trench and filling the trench with a dielectric material as is known in the art. Preferably, the STIs 203 are filled with a dielectric material such as an oxide material, a high-density plasma (HDP) oxide, or the like, formed by conventional methods known in the art.

The STIs 203 separate the substrate 201 into a first region 205 and a second region 207, which may be, but do not have to be, adjacent to each other (illustrated in FIG. 2 with wavy lines). The first region 205 of the substrate 201 and the second region 207 of the substrate 201 preferably have different conductivities. Preferably, the first region 205 comprises a p-type conductivity, and the second region 207 comprises an n-type conductivity.

Figure 3:
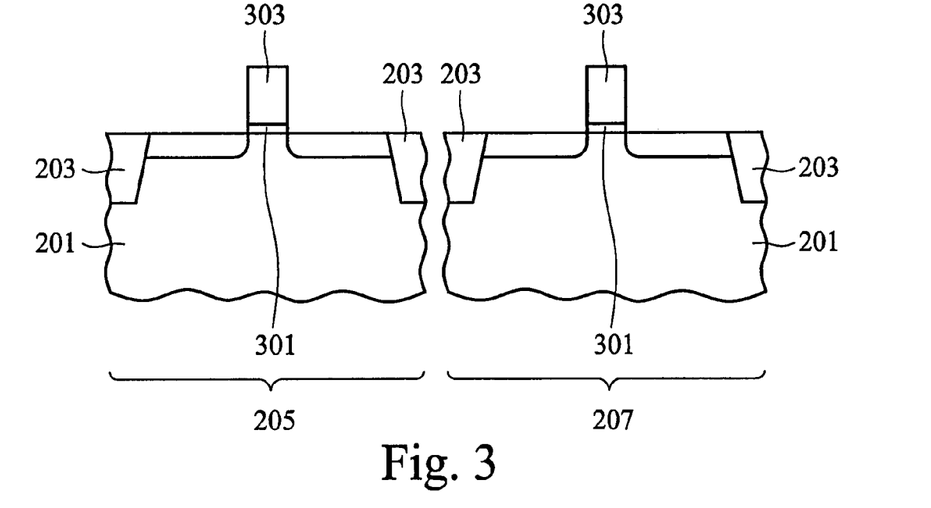

FIG. 3 illustrates the formation of the gate dielectrics 301 and gate electrodes 303. These gate dielectrics 301 and gate electrodes 303 may be formed and patterned on the substrate 201 by any suitable process known in the art. The gate dielectrics 301 are preferably a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. Preferably, the gate dielectrics 301 have a relative permittivity value greater than about 4.

In an embodiment in which the gate dielectrics 301 comprise an oxide layer, the gate dielectrics 301 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectrics 301 are between about 8 Å to about 50 Å in thickness, and are preferably about 16 Å in thickness.

The gate electrodes 303 preferably comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrodes 303 are poly-silicon, the gate electrodes 303 may be formed by depositing doped undoped poly-silicon by low-pressure chemical vapor deposition (LPCVD) to a thickness in the range of about 100 Å to about 2,500 Å, but more preferably about 1,500 Å.

Figure 4:
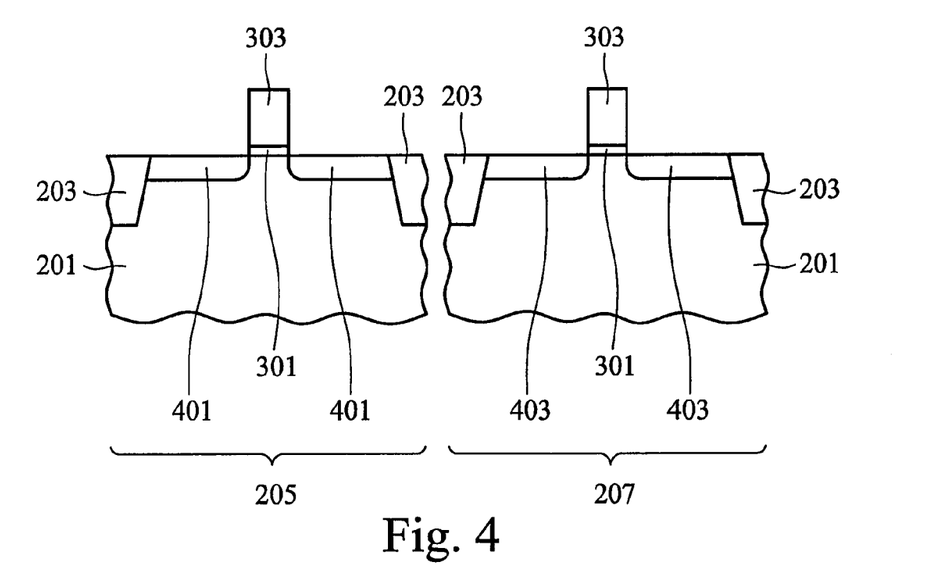

FIG. 4 illustrates the result after forming the first source/drain extensions 401 and the second source/drain extensions 403. The first source/drain extensions 401 (also known as lightly doped drains) are formed in the first region 205 of the substrate 201, preferably by implanting appropriate impurities using gate dielectric 301 and the gate electrode 303 as a mask. In an embodiment wherein the first region 205 of the substrate 201 has a p-type conductivity, the first source/drain extensions 401 may be formed by implanting n-type impurities, such as arsenic ions, phosphorous ions, or the like, in order to form an NMOS device. Because the gate dielectric 301 and gate electrode 303 are used as masks, the first source/drain extensions 401 are substantially aligned with the edges of the gate dielectric 301. As is known in the art, by adjusting the implanting energy level and impurity elements, impurities can be implanted to desired depths.

The second source/drain extensions 403 are formed in the second region 207 of the substrate 201, preferably by implanting appropriate impurities using the gate dielectric 301 and gate electrode 303 as a mask. In an embodiment in which the second region 207 of the substrate 201 has an n-type conductivity, the second source/drain extensions 403 may be formed by implanting p-type impurities such as boron ions, gallium ions, or the like, to form a PMOS device. Because the gate dielectric 301 and gate electrode 303 are used as a mask, the second source/drain extensions 403 are substantially aligned with the edges of the gate dielectric 301. As is known in the art, by adjusting the implanting energy level and impurity elements, impurities can be implanted to desired depths.

Figure 5:
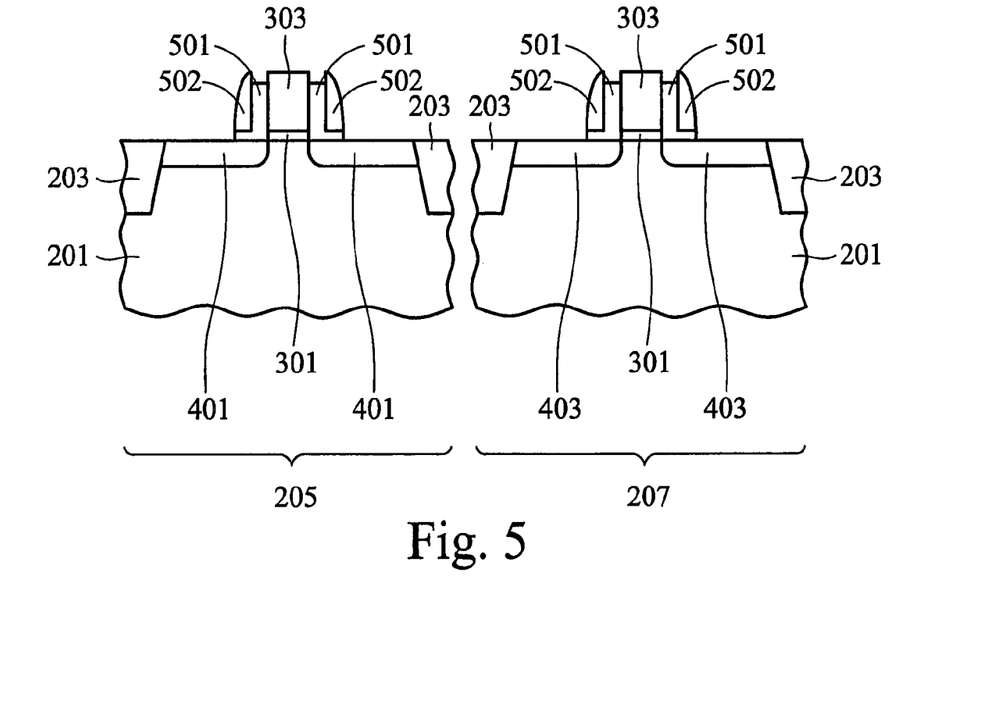

FIG. 5 illustrates the formation of a first set of spacers 501 and a second set of spacers 502 along the sidewalls of the gate dielectrics 301 and gate electrodes 303. Generally, the first set of spacers 501 and the second set of spacers 502 are formed by depositing a first spacer layer (not shown) on the previously formed structure and a second spacer layer (not shown) on the first spacer layer. The first spacer layer may comprise SiN, oxynitride, SiC, SiON, oxide, and the like, and preferably comprises silicon oxide. The first spacer layer may be formed by commonly used methods such as chemical vapor deposition (CVD), plasma enhanced CVD, sputter, and other methods known in the art.

The second spacer layer may be formed by blanket deposition of a dielectric material such as SiN, oxynitride, SiC, SiON, oxide, and the like, but preferably silicon nitride. However, the second spacer layer is preferably a different material than the first spacer layer in order to allow for a subsequent selective etch.

Thereafter, one or more etch processes as are known in the art, such as an anisotropic etch process, may be performed to remove undesired portions of the first spacer layer and the second spacer layer from the horizontal surfaces, thereby forming the first set of spacers 501 and the second set of spacers 502 as illustrated in FIG. 5.

Figure 6:
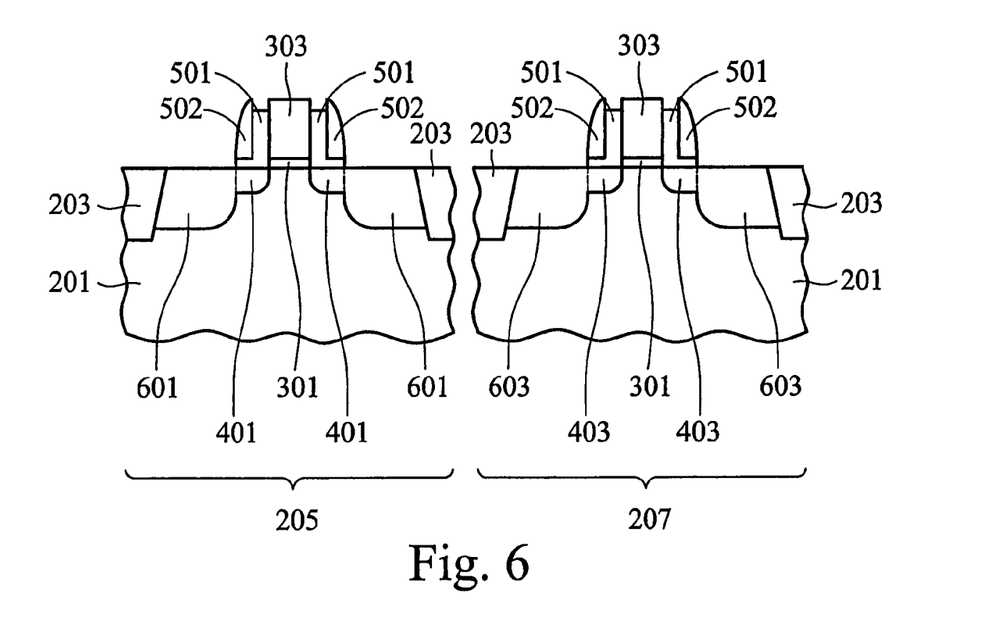

FIG. 6 illustrates the formation of a first source/drain region 601 and a second source/drain region 603 (also known as heavily doped regions). The first source/drain region 601 is formed in the first region 205 of the substrate 201 and may be formed in a manner similar to the formation of the first source/drain extensions 401 as described above, but the n-type ions are implanted to a further depth and the implantation uses both the first set of spacers 501 and the second set of spacers 502 as masks. The second source/drain region 603 is formed in the second region 207 of the substrate 201 and may be formed in a manner similar to the formation of the second source/drain extensions 403 as described above, but the p-type ions are implanted to a further depth and the implantation uses both the first set of spacers 501 and the second set of spacers 502 as masks.

Figure 7:
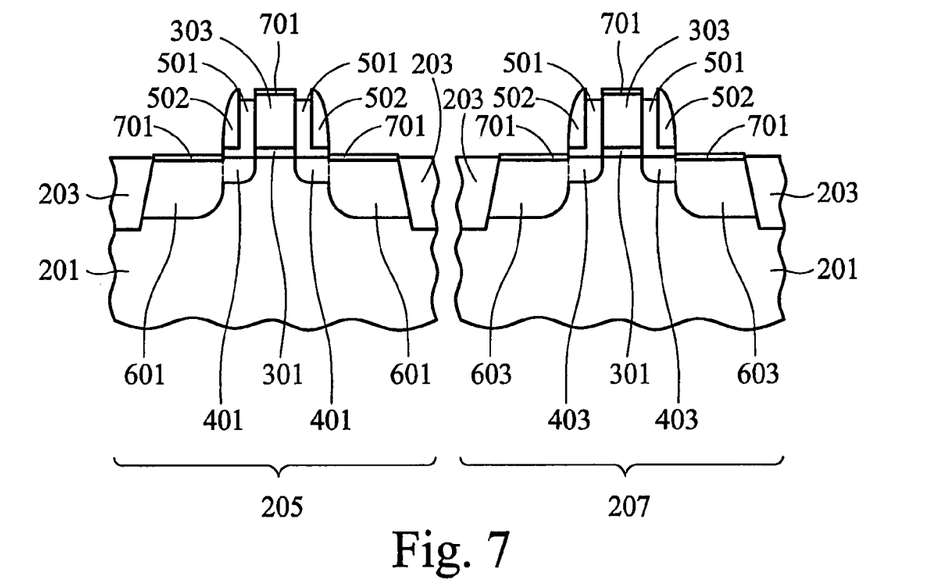

FIG. 7 illustrates the silicidation of a portion of the first source/drain region 601, the second source/drain region 603, and the gate electrodes 303, thereby forming a first set of silicide contacts 701. The first set of silicide contacts 701 preferably comprises nickel. However, other commonly used metals, such as titanium, cobalt, palladium, platinum, erbium, and the like, can also be used. As is known in the art, the silicidation is preferably performed by blanket deposition of an appropriate metal layer, followed by an annealing step in which the metal reacts with the underlying exposed silicon. Unreacted metal is then removed, preferably with a selective etch process. The thickness of the first set of silicide contacts 701 is preferably between about 3 nm and about 50 nm, with a preferred thickness of about 10 nm.

Figure 8:
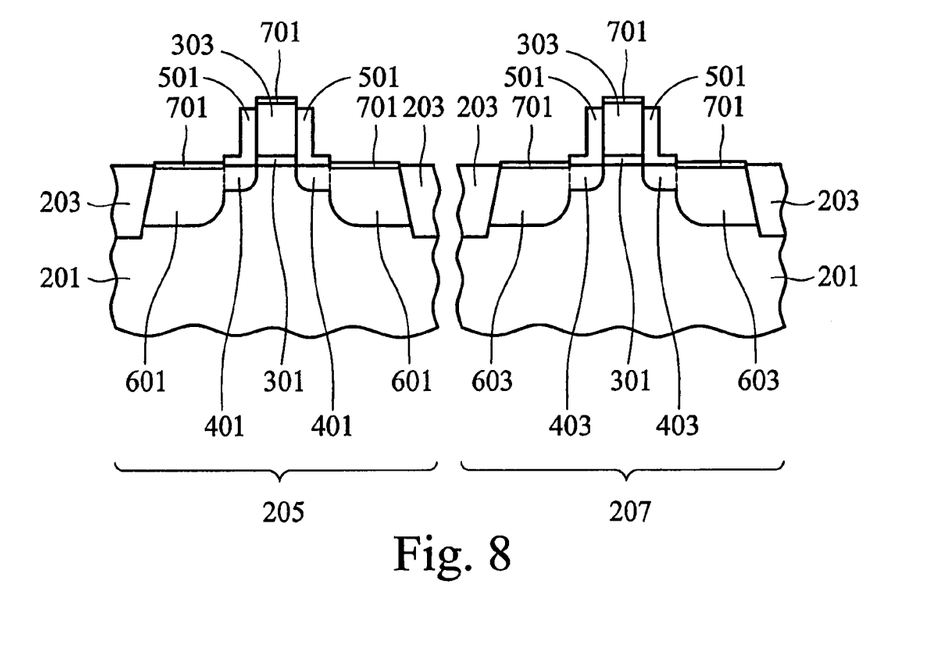

FIG. 8 illustrates the selective removal of the second set of spacers 502. After the first set of silicide contacts 701 have been formed, the second set of spacers 502 is selectively removed without removing either the first set of spacers 501 or the first set of silicide contacts 701. In an embodiment where the second set of spacers 502 is silicon nitride and the first set of spacers 501 is oxide, a wet-etch can be performed in order to selectively remove the second set of spacers 502, without substantially removing the first set of spacers 501.

Figure 9:
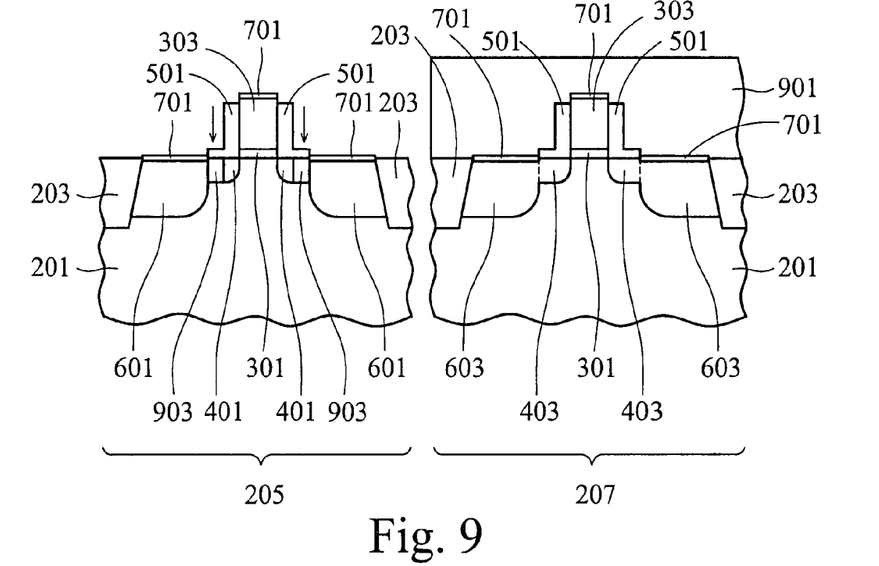

FIG. 9 illustrates an implantation of ions of a low work-function metal (for example, lanthanide metals that have a work function of between about 3.0 eV and about 4.5 eV, with a preferred work function of about 4.1 eV) such as ytterbium ions, erbium ions, and the like into the first source/drain extensions 401 located in the first region 205. In this process a first photoresist layer 901 is deposited and patterned, as known in the art, to cover the structures in the second region 207 while leaving the first region 205 exposed.

Once the second region 207 has been protected from the subsequent implants, ions such as ytterbium are implanted into a portion of the first source/drain extensions 401 to amorphize a portion of the first source/drain extensions 401 and form what will become a first silicide region 903. The ytterbium ions are preferably implanted into the first source/drain extensions 401 using the first set of spacers 501 and the first set of silicide contacts 701 as masks. The ytterbium ions will penetrate through the first set of spacers 501 and be implanted into the first source/drain extensions 401, but will not penetrate through the first set of silicide contacts 701.

Once the ions of ytterbium have been implanted, or alternatively, concurrently with the implantation of the ytterbium ions, complementary metal ions are also implanted into the first set of source/drain extensions 401, using the first set of spacers 501 and the first set of silicide contacts 701 as masks. The complementary metal ions preferably comprise nickel. Again, the metal ions will not penetrate through the first set of silicide contacts 701, but will penetrate through the first set of spacers 501 to implant into the first set of source/drain extensions 401.

Both the ytterbium and nickel ions are preferably implanted by ion implantation to a depth of between about 0.003 μm and about 0.3 μm, with a preferred depth of about 0.07 μm. The ytterbium and nickel ions are also preferably implanted to a concentration of between about $1 \times 10^{13}$ atoms/cm$^2$ to about $1 \times 10^{18}$ atoms/cm$^2$, with a preferred concentration of about $1.4 \times 10^{16}$ atoms/cm$^2$ for ytterbium and $4 \times^{16}$ atoms/cm$^2$ for nickel.

Figure 10:
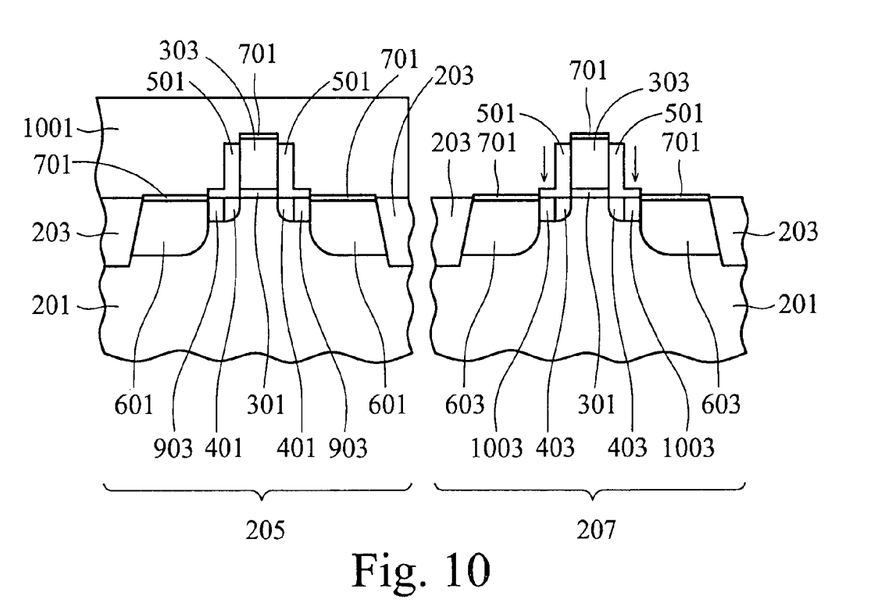

FIG. 10 illustrates the implantation of a high work-function metal (between about 4.6 eV and about 5.5 eV, with a preferred work function of about 5.2 eV) ions, such as platinum ions, iridium ions, and the like, into a portion of the second source/drain extensions 403 to form a second silicide region 1003. In this step the first photoresist layer 901 is removed from the second region 207 and a second photoresist layer 1001 is deposited and patterned as known in the art to cover the structures in the first region 205 while leaving the second region 207 exposed.

After the first region 205 has been protected from the subsequent implants, platinum ions are preferably implanted into a portion of the second source/drain extensions 403 in order to amorphize the second source/drain extensions 403. The platinum ions are preferably implanted into the second source/drain extensions 403 using the first set of spacers 501 and the first set of silicide contacts 701 as masks. The platinum ions will penetrate through the first set of spacers 501 and be implanted into the second source/drain extensions 403, but will not penetrate through the first set of silicide contacts 701.

Once the platinum ions have been implanted, or alternatively, concurrently with the implantation of the platinum ions, complementary metal ions are also implanted into the second set of source/drain extensions 403, using the first set of spacers 501 and the first set of silicide contacts 701 as masks. The complementary metal ions preferably comprise nickel. Again, the metal ions will not penetrate through the first set of silicide contacts 701, but will penetrate through the first set of spacers 501 to implant into the second set of source/drain extensions 403.

The platinum and nickel ions are preferably implanted by ion implantation to a depth of between about 0.03 μm and about 0.3 μm, with a preferred depth of about 0.07 μm. The platinum and nickel ions are also preferably implanted to a concentration of between about $1 \times 10^{13}$ atoms/cm$^2$ to about $1 \times 10^{18}$ atoms/cm$^2$, with a preferred concentration of about $4.5 \times 10_{15}$ atoms/cm$^2$ for the platinum ions and $4.5 \times 10^{16}$ atoms/cm$^2$ for the nickel ions.

Figure 11:
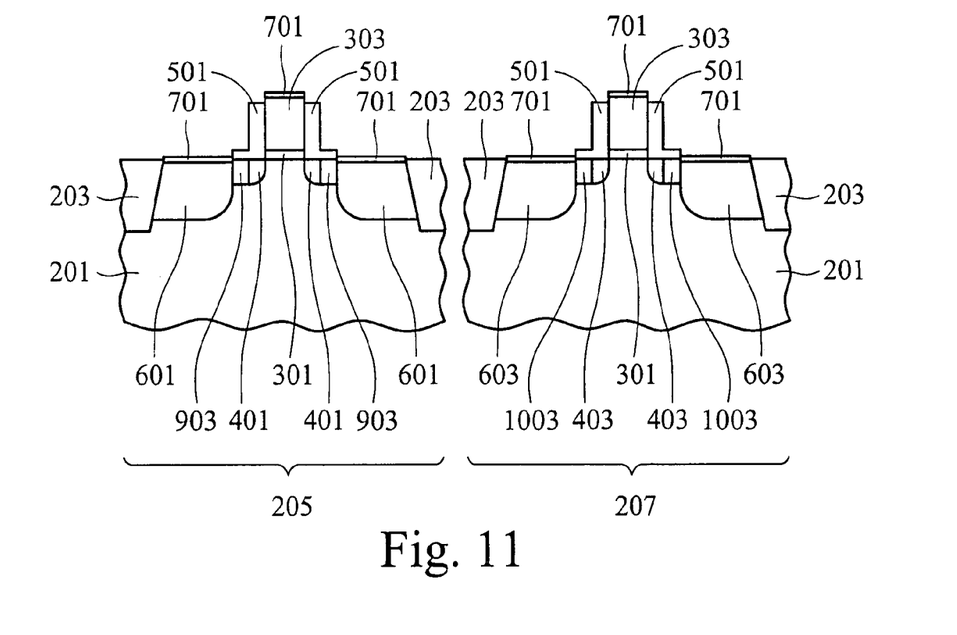

FIG. 11 illustrates the structure after the last implantation and the removal of the second photoresist layer 1001. After the removal of the second photoresist layer 1001, a low temperature rapid thermal anneal (RTA) is preferably performed to transform the material in the first silicide region 903 and the second silicide region 1003 into silicide alloys. In an embodiment where ytterbium and nickel are implanted into the first silicide region 903, and platinum and nickel are implanted into the second silicide region 1003, the first silicide region 903 is an alloy comprising Ni$_2$YbSi and the second silicide region 1003 is an alloy comprising Ni$_2$PtSi. Other annealing methods, such as placing the structure in a furnace or placing the structure into a PVD chamber or on a hot plate and surrounding it with either a vacuum, nitrogen, or helium, could alternatively be used to anneal the structures.

After the initial annealing process described above with reference to FIG. 11, a selective etching may be performed to remove any metal ions or metal-containing oxide layers that were formed on either the STIs 203 or the first set of spacers 501. The unreacted metal ions and metal-containing oxide layers can be removed, for example, by a wet-etch process.

Optionally, an additional anneal may be performed after the removal of the extraneous metal ions and metal-containing oxide layers. As described above with respect to the first anneal, the second anneal process is preferably an RTA, but could alternatively be performed using other methods known in the art. In an embodiment where ytterbium and nickel are implanted into the first silicide region 903, and platinum and nickel are implanted into the second silicide region 1003, this second anneal would transform the Ni$_2$YbSi containing alloy into an alloy comprising NiYbSi in the first silicide region 903 and transform the Ni$_2$PtSi containing alloy into an alloy comprising NiPtSi in the second silicide region 1003. The further annealing of the first silicide region 903 and the second silicide region 1003 creates contacts with near band-edge work-functions to further reduce the parasitic resistance of the devices.

Figure 12:
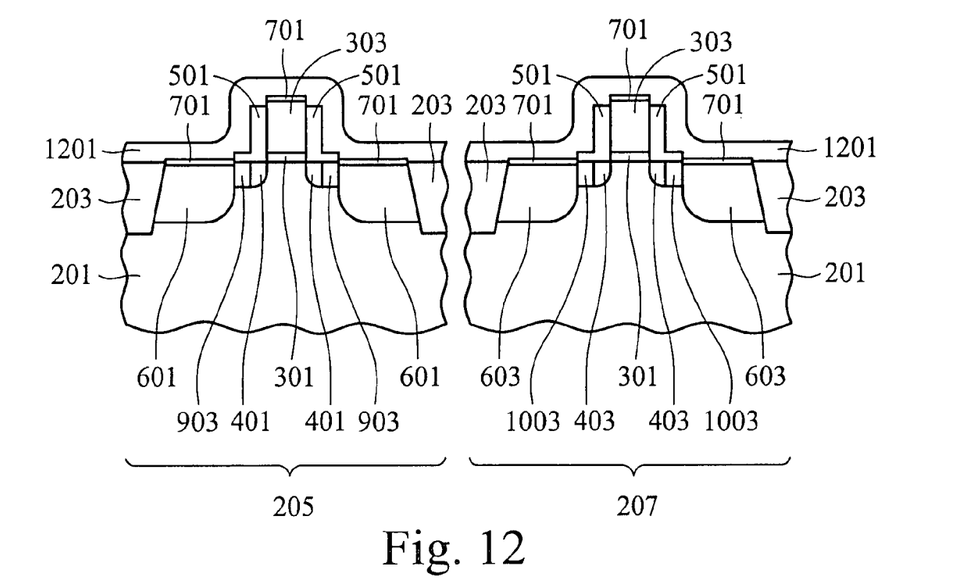

As illustrated in FIG. 12, once the first silicide region 903 and the second silicide region 1003 have been formed, a contact etch-stop layer (CESL) 1201 could optionally be placed over the structure. This CESL 1201 could be used to protect the devices from damage caused by further processing, or else could alternatively be used to create strain in the channel region of the devices in order to promote better efficiency. In one embodiment, the CESL 1201 is formed of silicon nitride using plasma enhanced chemical vapor deposition (PECVD). Other materials such as nitride, oxynitride, combinations thereof, or the like, and alternative techniques of forming the CESL 1201, such as low pressure CVD (LPCVD), could alternatively be used. The CESL 1201 preferably has a thickness of between about 50 Å and about 2,000 Å, with a preferred thickness of about 700 Å.

One of ordinary skill in the art will appreciate that the embodiments of the present invention may incorporate other features. For example, embodiments of the present invention may incorporate raised source/drain regions, stress layers/regions, different gate structures including multi-layered gates, and/or the like.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate with isolation regions formed therein;
   a gate dielectric and a gate electrode on the substrate;
   spacers along sidewalls of the gate dielectric and the gate electrode;
   source/drain extensions in the substrate on opposing sides of the gate dielectric;
   source/drain regions in the substrate on opposing sides of the gate dielectric and the source/drain extensions;
   first silicide regions located beneath the spacers in the source/drain extensions on opposing sides of the gate dielectric; and
   second silicide regions on a surface of the substrate on opposing sides of the gate dielectric and the spacers, wherein the second silicide regions extend into the substrate less than the first silicide region.

2. The semiconductor device of claim 1, wherein the source/drain regions have an n-type conductivity.

3. The semiconductor device of claim 2, wherein the first silicide regions comprise $Ni_2YbSi$.

4. The semiconductor device of claim 2, wherein the first silicide regions comprise $NiYbSi$.

5. The semiconductor device of claim 1, wherein the source/drain regions have a p-type conductivity.

6. The semiconductor device of claim 5, wherein the first silicide regions comprise $Ni_2PtSi$.

7. The semiconductor device of claim 5, wherein the first silicide regions comprise $NiPtSi$.

8. A semiconductor device comprising:
   a substrate with isolation regions formed therein, the substrate comprising a first region and a second region;
   a first MOS device in the first region, the first MOS device comprising:
     a first gate stack comprising a first gate dielectric and a first gate electrode;
     first spacers located on sidewalls of the first gate stack;
     first source/drain extensions located in the substrate on opposing sides of the gate stack;
     first source/drain regions located in the substrate on opposing sides of the gate stack and the first source/drain extensions;
     first silicide regions located in the first source/drain extensions; and
     second silicide regions located in the first source/drain regions on opposite sides of the gate stack and the first spacers, wherein the first silicide regions extend further into the substrate than the second silicide regions; and
   a second MOS device in the second region, the second MOS device comprising:
     a second gate stack comprising a second gate dielectric and a second gate electrode;
     second spacers located on the sidewalls of the second gate stack;
     second source/drain extensions located in the substrate on opposing sides of the gate stack;
     second source/drain regions located in the substrate on opposing sides of the gate stack and the first source/drain extensions;
     third silicide regions located in the second source/drain extensions; and
     a fourth set of silicide regions located in the second source/drain regions on opposite sides of the gate stack and the second spacers.

9. The semiconductor device of claim 8, wherein the first MOS device is an NMOS device, and the second MOS device is a PMOS device.

10. The semiconductor device of claim 9, wherein the first silicide regions comprise $Ni_2YbSi$.

11. The semiconductor device of claim 9, wherein the first silicide regions comprise $NiYbSi$.

12. The semiconductor device of claim 9, wherein the third silicide regions comprise $Ni_2PtSi$.

13. The semiconductor device of claim 9, wherein the third silicide regions comprise $NiPtSi$.

14. A semiconductor device comprising:
    a substrate with isolation regions formed therein;
    a gate stack comprising a gate dielectric and a gate electrode on the substrate;
    first spacers, located along sidewalls of the gate stack;
    source/drain regions in the substrate on opposing sides of the gate stack, each of the source/drain regions comprising a lightly doped region located on opposing sides of the gate stack and a heavily doped region located adjacent to the lightly doped region;
    first silicide regions located on at least a portion of a surface of the heavily doped region and on the gate electrode, the first silicide regions formed of a first material; and
    second silicide regions in at least a portion of the lightly doped regions, the second silicide regions formed of a second material, the second material being different than the first material, wherein the first spacers overlie at least a portion of the second silicide regions and the second silicide regions extend away from the gate stack further than the first silicide regions.

15. The semiconductor device of claim 14, wherein the source/drain regions have an n-type conductivity.

16. The semiconductor device of claim 15, wherein the second silicide regions comprise $Ni_2YbSi$.

17. The semiconductor device of claim 15, wherein the second silicide regions comprise NiYbSi.

18. The semiconductor device of claim 14, wherein the source/drain regions have a p-type conductivity.

19. The semiconductor device of claim 18, wherein the second suicide regions comprise $Ni_2PtSi$.

20. The semiconductor device of claim 18, wherein the second suicide regions comprise NiPtSi.

* * * * *

UNITED STATES PATENT AND TRADEMARK OFFICE
CERTIFICATE OF CORRECTION

PATENT NO. : 7,629,655 B2
APPLICATION NO. : 11/688592
DATED : December 8, 2009
INVENTOR(S) : Yu et al.

It is certified that error appears in the above-identified patent and that said Letters Patent is hereby corrected as shown below:

In Col. 3, line 51, before undoped insert --or--.
In Col. 10, line 4, delete "suicide" and insert --silicide--.
In Col. 10, line 6, delete "suicide" and insert --silicide--.

Signed and Sealed this

Eighth Day of June, 2010

David J. Kappos
*Director of the United States Patent and Trademark Office*